United States Patent [19]

Mak et al.

[11] Patent Number: 5,384,009
[45] Date of Patent: Jan. 24, 1995

[54] PLASMA ETCHING USING XENON

[75] Inventors: Steven Mak, Pleasanton; Brian Shieh, Fremont; Charles S. Rhoades, Los Gatos, all of Calif.

[73] Assignee: Applied Materials, Inc., Santa Clara, Calif.

[21] Appl. No.: 78,131

[22] Filed: Jun. 16, 1993

[51] Int. Cl.⁶ .............................................. H01L 21/00
[52] U.S. Cl. ................... 156/662; 156/643; 156/646; 156/656
[58] Field of Search ............... 156/643, 646, 662, 656

[56] References Cited

U.S. PATENT DOCUMENTS

| | | |
|---|---|---|
| 4,190,488 | 2/1980 | Winters .................. 156/643 |
| 4,468,285 | 8/1984 | Bayman et al. .......... 156/643 |
| 4,744,861 | 5/1988 | Matsunaga et al. ...... 156/643 |
| 4,789,426 | 12/1988 | Pipkin ..................... 156/643 |
| 4,949,350 | 8/1990 | Jewell et al. ............. 372/96 |
| 5,002,632 | 3/1991 | Loewenstein et al. ... 156/643 |
| 5,030,319 | 7/1991 | Nishino et al. .......... 156/643 |
| 5,034,344 | 7/1991 | Jewell et al. ............. 372/45 |
| 5,108,543 | 4/1992 | Suzuki et al. ............ 156/643 |
| 5,173,151 | 12/1992 | Namose ................... 156/643 |

FOREIGN PATENT DOCUMENTS

| | | |
|---|---|---|
| 56-13767 | 4/1991 | Japan . |
| 56-137637 | 10/1981 | Japan . |
| 02065132 | 3/1990 | Japan . |
| 3-78229 | 4/1991 | Japan . |

OTHER PUBLICATIONS

"Mechanisms of Sputtering of Si in a Cl2 Environment by Ions with Energies Down to 75 eV"; J. Appl. Phys. vol. 64, No. 1, Jul. 1988; Oostra et al.; abstract only.

*Primary Examiner*—R. Bruce Breneman
*Assistant Examiner*—George Goudreau
*Attorney, Agent, or Firm*—Ashok K. Janah

[57] ABSTRACT

A process for selectively etching a substrate, having grain boundaries and a resist material thereon, is described. The substrate is placed into an etch zone and a process gas comprising a primary etchant, a secondary etchant, and xenon is introduced into the etch zone. A plasma is generated in the zone to form an etch gas from the process gas, that substantially anisotropically etches the substrate at fast rates, with good selectivity, and reduced profile microloading. Preferably the primary etchant comprises $Cl_2$, and the secondary etchant comprises $BCl_3$.

26 Claims, 2 Drawing Sheets

PLASMA ETCHING USING XENON

BACKGROUND

The present invention relates to processes for etching semiconductor wafers.

Reactive ion etching processes are used in the fabrication of semiconductor and other devices with submicron sized features, such as integrated circuit chips. These processes are used to selectively etch a substrate, where portions of the substrate are protected by a patterned etch-resistant "resist" material, such as photoresist or oxide-hardmask. The resist protected portions form "features" on the substrate which become part of the integrated circuit being processed. Etching is effected by introducing a process gas into a chamber and generating a plasma in the chamber, to create an etch gas from the process gas. The etch gas etches the substrate to create a volatile etch byproduct compound, which is then removed from the chamber.

Typically, the process gas comprises $Cl_2$, $BCl_3$ and optionally $N_2$. A problem with this process gas is that relatively thick residues or deposits form on the chamber walls and on the resist material. Some of these deposits form because the etch gas chemically reacts with the resist material. The deposit on the chamber walls can flake off to form particles that contaminate the wafers. Further, the formation of excessive amounts of residue on the resist can undesirably increase the area protected by the resist material, rendering the processed wafer unsuitable for use.

A deposited layer can also form on the sidewalls of the freshly etched channels in the substrate. This deposit serves as a "passivating" layer which hinders continued etching, thereby preventing "isotropic" etching or undercutting. Isotropic etching occurs when etching proceeds horizontally below the resist layer, instead of vertically through the uncoated portions, resulting in the lower portions of the features being inwardly sloped. Although vertical "anisotropic" etching is desirable, an excessive deposit of passivating layer on the sidewalls is difficult to clean. Thus, it is desirable to have an etching process that either produces less build-up of deposit, or which reduces build-up by etching the deposit layers during the etch process.

Furthermore, typical reactive-ion etching systems result in high profile microloading. High profile microloading causes the cross-sectional profile of the features formed in the substrate to vary as a function of the spacing between the features. It is desirable to have an etching process which provides features with a uniform cross-section regardless of the spacing between the features.

It is also desirable to obtain high etch rates for process efficiency and to obtain a high etching selectivity ratio so that the rate of etching of the resist layer is substantially lower than the rate of etching of the substrate.

In plasma etch processes, it is also desirable for the process gases to have a low ionization potential so that less energy is required to ionize the gases. It is also advantageous that the process gases have a wide range of excitation energies so that energy transfer reactions, which promote etching efficacy, can occur between the various gaseous species. Also, gases with low corrosivity are preferred so that the corrosive effect of the etch gas on the processing apparatus is minimized.

Accordingly, there is a need for a process for selectively etching semiconductor substrates which minimizes formation of deposits on the chamber walls, which does not form excessive deposits on the sidewalls of the etched channels, which provides substantially anisotropic etching, which does not result in formation of oversized features, and which reduces profile microloading. It is also desirable to obtain high etch rates and a high substrate-to-resist etch selectivity ratio. Also, it is preferred that the process gases have low corrosivity, low ionization potential, and a broad range of excitation energies.

SUMMARY

The present invention is directed to a process that satisfies these needs. In the process, a substrate with grain boundaries and having a resist thereon, is placed into an etch zone, and a process gas is introduced into the etch zone. The process gas lacks oxygen and comprises: (i) a primary etchant selected from the group consisting of chlorine, fluorine, and bromine; (ii) a secondary etchant suitable for etching grain boundaries in the substrate; and (iii) xenon. A gas passivator such as $N_2$, HCl, $CHF_3$, $CF_4$, $CH_4$, or mixtures thereof, can be added to the process gas. A substantially oxygen-free plasma is generated in the etch zone to form an etch gas from the process gas which selectively etches the substrate.

Preferably, the secondary etchant is also suitable for etching the surface oxide layer on the substrate, and more preferably the secondary etchant is selected from the group consisting of $BCl_3$, $SiCl_4$, $CCl_4$, and mixtures thereof.

The volumetric flow ratio of the primary etchant: secondary etchant:xenon is selected so that the substrate to resist etching selectivity ratio is greater than about 2.5. Preferably, the flow ratio of secondary etchant to primary etchant is selected so that the rate of etching of the grain boundaries in the substrate is substantially the same as the rate of etching of the grains. Thus, preferably the volumetric flow ratio secondary etchant to primary etchant is from about 0.1:1 to about 2:1, and more preferably from about 0.3:1 to about 0.5:1.

Preferably, the volumetric flow ratio of xenon-to-primary etchant is selected so that the substrate is etched substantially anisotropically. Thus, preferably the xenon:primary etchant ratio is from about 0.1:1 to about 1:1, and more preferably from about 0.2:1 to about 0.5:1. Preferably, the passivator:primary etchant ratio is less than about 1:1, and is more preferably less than about 0.6:1.

DRAWINGS

These and other features, aspects, and advantages of the present invention will become better understood from the following drawings, description and appended claims, where:

DESCRIPTION

The present invention is directed to a reactive ion etching process for etching a substrate having grain boundaries and a resist layer thereon. A process gas is introduced into an etching zone containing the substrate. The process gas is absent oxygen, and comprises: (i) a primary etchant selected from the group consisting of chlorine, fluorine and bromine; (ii) a secondary etchant suitable for etching grain boundaries in the substrate; and (iii) xenon. A substantially oxygen-free plasma is generated in the etch zone, to form an etch gas, from the process gas, which selectively etches the substrate.

Figure 1A:
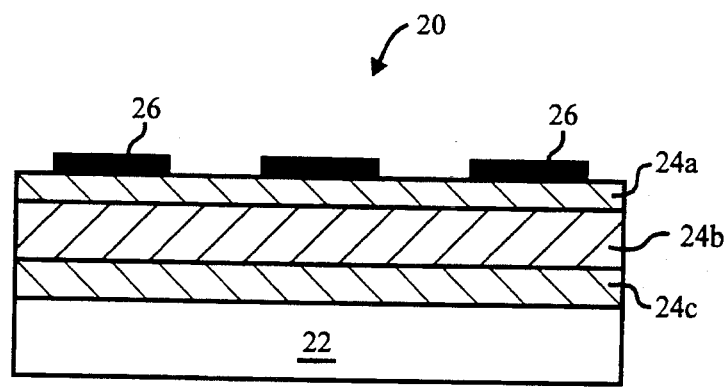
FIG. 1a is a schematic view in vertical cross-section, of a substrate having a resist material thereon.
Figure 1B:
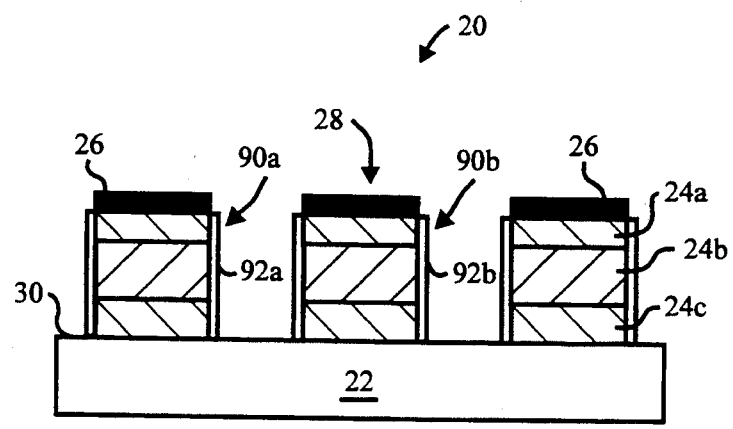
FIG. 1b is a schematic view in vertical cross-section, of the substrate of FIG. 1a after etching of the substrate.

With reference to FIGS. 1a and 1b, the substrate 20 can be a semiconductor, metal, glass, or ceramic wafer 22. Typically, the substrate 20 is a silicon or gallium arsenide wafer 22 having a plurality of layers 24 thereon. The layers 24 on the substrate can be metal, oxide, nitride, polysilicon or silicide layers.

A resist material 26, such as photoresist or oxide hardmask, which is substantially resistant to etching is applied on top of the substrate layers. The resist 26 can be applied in a patterned overlay, as shown in FIG. 1a. The resist 26 overlay protects portions of the substrate 20 so that, after the substrate 20 is etched, the protected portions of the substrate form features 28 that are part of the semiconductor device being processed. In present day technology, the features 28 can be laterally sized from about 0.5 to about 10 microns, and the spacings 30 between the features 28 can be on the order of at least about 0.5 microns.

Typically, the substrate 20 has grains and grain boundaries. Each grain comprises a substantially ordered crystalline structure. The grain boundaries are the interfaces between the grains, which represent departures from the ordered structure of the grain, and which can contain impurities, such as oxide films.

Figure 2:
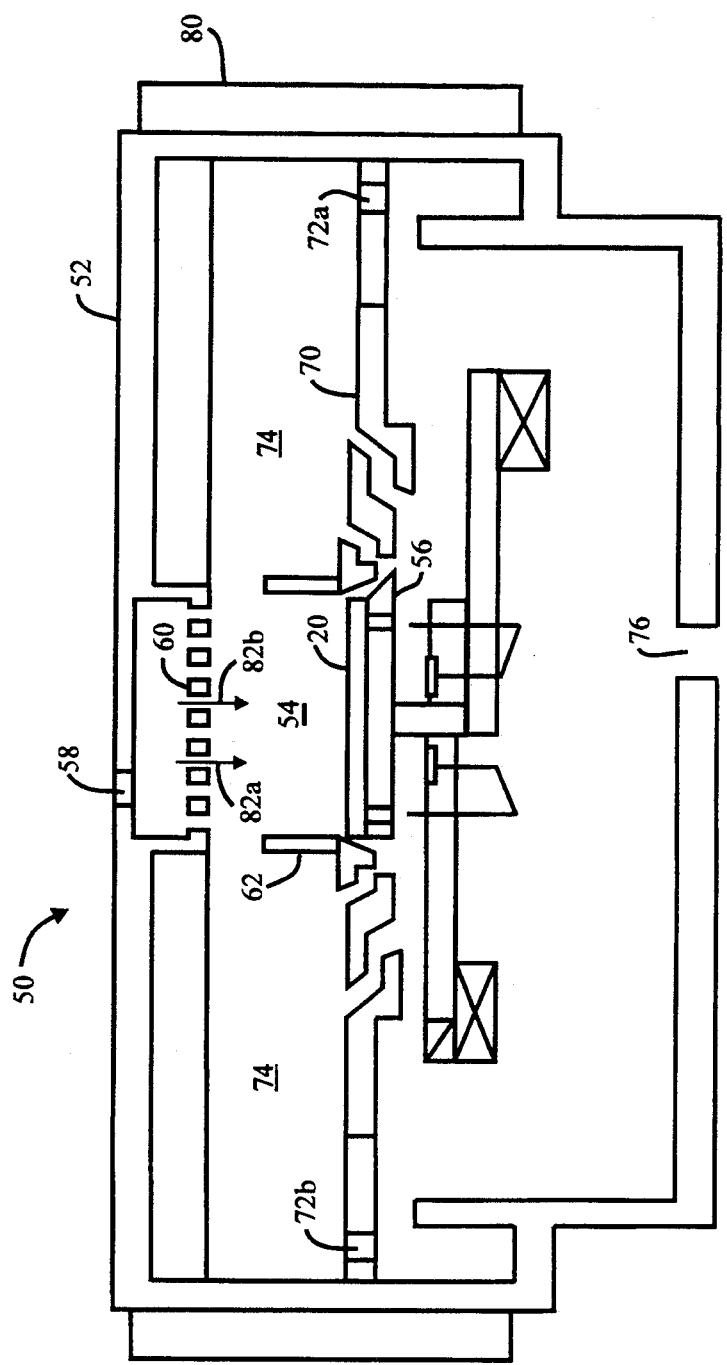
FIG. 2 is a schematic view in vertical cross-section, of an apparatus suitable for practicing the process of the present invention.

With reference to FIG. 2, a reaction apparatus 50 suitable for practicing the present invention comprises an etching chamber 52 having an etch zone 54. The substrate 20 is typically placed on a cathode 56 in the etch chamber 52. Process gas is introduced into the etch chamber 52 through the gas inlet 58. Thereafter, the gas passes through a "showerhead" diffuser plate 60 which distributes the process gas in the etch zone 54. A focus ring 62 can be used to substantially maintain the plasma in the etch zone 54.

A barrier or pumping plate 20, with a plurality of exhaust holes 72 therethrough, separates the etching chamber 52 into two zones, an etching zone 54 and a non-etching zone 74. The exhaust holes 72 are in fluid communication with a vacuum pump through the exhaust port 76 for withdrawing spent process gas and volatile etch byproduct compounds from the etching chamber 52. The reaction apparatus 50 can be a magnetically enhanced reactor, having a magnetic coil 80 around the etching chamber 52 to magnetically enhance the plasma formed in the etching zone 54.

To use the reaction apparatus 50, a substrate 20 is placed on the cathode 56, and the process gas is introduced through the gas inlet 58 into the etch zone 54. A substantially oxygen-free plasma is generated in the etch zone 54 to form an etch gas from the process gas, which selectively etches the substrate. The flow of the etch gas is shown by the arrows 82.

Preferably, the primary etchant is chlorine. Preferably, the secondary etchant is selected from the group consisting of $BCl_3$, $SiCl_4$, $CCl_4$, and mixtures thereof, and more preferably, the secondary etchant is $BCl_3$. The process gas can further comprise a gas passivator selected from the group consisting of $N_2$, HCl, $CHF_3$, $CF_4$, $CH_4$, and mixtures thereof. Preferably, the gas passivator is $N_2$. The process gas can further comprise a chlorofluorocarbon, such as "FREON-14", manufactured by E. I. Du Pont de Nemours, Wilmington, Del.

The composition of the process gas is controlled by adjusting the volumetric flow ratios of the primary etchant:secondary etchant:xenon. By "volumetric flow ratio" it is meant the ratio of the volume per unit time of one gas to the volume per unit time of the second gas. The flow rates of the gases were measured using mass flow controllers. It is believed the three-part ratio of primary etchant to secondary etchant to xenon controls the etch rate, the amount of deposit found on the chamber walls, and the amount of deposition on the etch channel sidewalls.

Preferably, the volumetric flow ratio of primary etchant:secondary etchant:xenon is selected so that the substrate to resist etching selectivity ratio is greater than about 2.5. The etching selectivity ratio is defined as the rate at which the substrate is etched divided by the rate at which the resist is etched. The addition of xenon to the process gas provides an etch gas with a higher etching selectivity ratio than an etch gas without xenon. However, the addition of too much xenon slows down the rate of etching of the substrate.

The volumetric flow ratio of secondary etchant to primary etchant is selected so that the rate of etching of the grain boundaries of the substrate is substantially the same as the rate of etching of the grains of the substrate. Preferably, the volumetric flow ratio of secondary etchant to primary etchant is from about 0.1:1 to about 2:1, and more preferably from about 0.3:1 to about 0.5:1.

The volumetric flow ratio of xenon to primary etchant is selected so that the substrate is etched substantially anisotropically, and at an etching rate substantially higher than the rate at which the resist is etched. Preferably, the volumetric flow ratio of xenon:primary etchant is from about 0.1:1 to about 1:1, and more preferably from about 0.2:1 to about 0.5:1.

The volumetric flow ratio of passivator to primary etchant is preferably less than about 1:1, and more preferably less than about 0.6:1. Insufficient gas passivator results in undercutting, i.e. etching of the layer below the resist material. Excess passivator results in slow etch rates and the formation of excessive deposits on the chamber walls and the freshly etched channel and sidewalls.

The process gas is introduced at a rate which is sufficient that the rate of etching the substrate is greater than about 5,000 Å per minute. Preferably, the flow rate of the primary etchant is from about 10 to about 100 sccm, and more preferably, the flow rate is from about 40 to about 60 sccm.

After the process gas is introduced into the etch zone 54, a substantially oxygen-free plasma is generated in the etch zone 54 to form an etch gas from the process gas. The etch gas etches the substrate 20. The DC bias used to generate the plasma is generally from about $-250$ to about $-450$ Volts, and the amount of power typically from about 600 to about 1,000 Watts, more preferably from about 700 to about 900 Watts, and most preferably about 800 Watts.

The plasma may be enhanced by a method such as electron cyclotron resonance, magnetically enhanced reactors and inductively coupled plasma. Preferably, a magnetically enhanced ion reactor is used. The magnetic field in the reactor must be sufficiently strong to increase the density of the ions formed in the plasma, but not so strong as to induce charge-up damage, which would damage features such as CMOS gates. Generally, the magnetic field on the wafer surface is no more than 500 Gauss, typically it is from about 10 to about 100 Gauss, and more preferably from about 20 Gauss to about 80 Gauss.

Typically, the chamber is maintained at a pressure of from about 1 mTorr to about 300 mTorr, preferably at least about 100 mTorr, and most preferably from about 100 to about 200 mTorr.

The cathode can be heated using a heating source, such as a lamp, underneath the cathode. The cathode is preferably heated to temperatures sufficiently high to volatilize etching by-products, and sufficiently low that a thin layer of passivating deposit on the sidewalls of freshly etched channels is not volatilized. Typically, the cathode is heated to a temperature of about 50° to about 100° C., and more preferably from about 60° C. to about 90° C. A flow of helium on the back of the wafer at a pressure of about 10 Torr can be used to control the temperature of the wafer.

The chamber wall metal should be heated so that less deposit forms on the walls of the chamber. Preferably, the chamber wall is heated to a temperature below the temperature of the substrate, and from about 45° C. to about 85° C., and more preferably to about 65° C.

The process conditions can be varied during the etching process. For example, when etching multiple layers of the substrate, typically the process has multiple stages. The process conditions for each stage can depend upon the layer that is being etched.

After etching the wafer, residual resist material and sidewall deposition on the wafer features, were removed by dry stripping alone, or dry stripping in combination with a wet process. The dry stripping was carried out either in a "BRANSON" resist etcher, with an etching time of 75 minutes, or in "GASONICS" resist stripper for two minutes. The wet process can either be a dip of 90° C. for 10 minutes in a conventional stripping product sold under the trademark "ACT-150", or a dip at room temperature for 3 minutes in a conventional ethylene glycol base stripping solvent sold under the trademark "Ashland ROA".

EXAMPLES

The following examples demonstrate the efficacy of the present invention. These examples were effected using a magnetically enhanced reactive ion reactor, and in particular, a "Precision 5000" Mark II system available from Applied Materials Inc., Santa Clara, Calif., using an aluminum etch Phase II process kit.

The wafers used were silicon wafers of 200 mm (8 inch) diameter, coated successively with a 0.1 micron layer of titanium; 1 micron layer of aluminum, containing 0.5 percent copper; 0.04 micron layer of TiN; and resist in selected areas in a thickness of about 1.5 microns. A G-line photoresist material was used. The resist was placed on about 50 percent of the surface area of the wafer, to generate features of varying spacing and size. The highest density features were spaced apart by about 0.8 microns, and typically the features were about 0.6 microns wide.

All the wafers were baked at 110° C. for 30 minutes before etching. After the etching process was completed, the wafers were rinsed in distilled water and baked at 100° C. for 30 minutes.

In some of the examples below, SEM photos of the etched wafers were used to evaluate (i) photoresist remaining, (ii) sidewall smoothness, and (iii) amount of deposit remaining on the features, the latter either immediately after the plasma etch process, or after the dry/wet stripping operation described above. Etch rates were calculated by measuring the depth of the features in partially etched wafers.

When the wafer is etched in multiple stages, the progress of the etch was monitored by monitoring the composition of the gas withdrawn from the chamber using a optical omission technique. When the composition of this gas changed, it signified that one layer has been etched through and the second layer was being etched. At this time, the composition of the process gases and other process conditions is changed to provide greater etching efficiency for the layer being etched.

Examples 1-2

To compare an etching process where xenon was added to the process gas to an etch process without xenon, two experiments were conducted as shown in Table 1. Only the BCl3 and xenon flow rates were changed between the runs. In Example 2, where xenon was added, the etch selectivity was higher and better profile microloading was observed. Also, in Example 2, the thickness of the photoresist layer remaining after etching was about 0.9 micrometer versus 0.8 micrometer remaining for Example 1. Thus, addition of xenon improved etch selectivity and profile microloading.

Examples 3-4

The process conditions for Examples 3 and 4 are shown in Table 2. The wafers were etched in three stages: a preliminary etch, a main etch, and a final etch. The preliminary etch was time to breakthrough the overlayer of TiN so that the aluminum layer underneath was beginning to be etched. The main etch was conducted until the aluminum layer was etched through, or at "EPB" which stands for "end point at bottom." The progress of the etch at all stages was monitored by monitoring the composition of gas withdrawn from the chamber using an optical emission technique. The EPB was determined at a point at which the content of aluminum in the gas withdrawn from the etching chamber substantially decreased. The final etch was timed so that the underlayer of TiN was etched.

TABLE 1

| RESULTS AND PROCESS CONDITIONS FOR EXAMPLES 1-2 | | |
|---|---|---|
| EXAMPLE | 1 | 2 |
| Pressure (mT) | 200 | 200 |
| Power (Watts) | 800 | 800 |
| Magnetic Field (G) | 20 | 20 |
| Cl$_2$ (sccm) | 50 | 50 |
| BCl$_3$ (sccm) | 50 | 10 |
| Xe (sccm) | 0 | 50 |
| N$_2$ (sccm) | 50 | 50 |
| Cathode Temp. (°C.) | 80 | 80 |
| Wall Temp. (°C.) | 65 | 65 |
| Etch Time (secs) | 148 | 152 |
| DC Bias (volts) | −327 | −379 |
| PR Remaining[1] (micrometers) | 0.8 | 0.9 |
| Residue[2] | A | A |

TABLE 1-continued

RESULTS AND PROCESS CONDITIONS FOR EXAMPLES 1-2

| EXAMPLE | 1 | 2 |
|---|---|---|
| Side-wall Thickness[2] | C | A |

Note:
[1]Photoresist thickness remaining after etch.
[2]A = Excellent; B = Good; C = Poor.

TABLE 2

PROCESS CONDITIONS FOR EXAMPLES 3-4

|  | Example 3 | | | Example 4 | | |
|---|---|---|---|---|---|---|
|  | Preliminary | Main | Final | Preliminary | Main | Final |
| Pressure (mT) | 30 | 200 | 30 | 30 | 200 | 30 |
| Power (W) | 500 | 625 | 300 | 500 | 625 | 300 |
| Magnetic Field (G) | 0 | 20 | 0 | 0 | 20 | 0 |
| Flow Rate (sccm) $Cl_2$ | 10 | 45 | 20 | 10 | 45 | 20 |
| $BCl_3$ | 20 | 45 | 25 | 20 | 20 | 25 |
| Xe | 20 | 0 | 15 | 20 | 25 | 15 |
| $N_2$ | 10 | 20 | 0 | 10 | 20 | 0 |
| Time (sec) | 20 | EPB | 30 | 20 | EPB | 30 |

Notes:
(1) EPB = End point at bottom
(2) In both main etching steps, the cathode temperature was maintained at about 80° C.

Examples 3 and 4 demonstrate that the addition of xenon in the main etching step, provides a process with less deposit formation and provides a higher photoresist to metal etching selectivity ratio. The thickness of the photoresist layer after etching in Example 4, where xenon was used, was about 1.12 micrometers versus 0.98 micrometers of photoresist remaining for Example 3.

Example 5-14

In these examples, the primary etchant:secondary etchant:xenon ratio was varied using a factorial design study involving a $L_9$ ($3^4$) orthogonal matrix. Three levels or values were selected for four process variables, power, $Xe:Cl_2$ ratio, $N_2:Cl_2$ ratio, and $HCl:Cl_2$ ratio, as shown in Table 3.

TABLE 3

$L_9$ ($3^4$ ORTHOGONAL MATRIX CONDITIONS

|  | Level | | |
|---|---|---|---|
| Factors | I | II | III |
| Power (watts) | 700 | 800 | 900 |
| $Xe/Cl_2$ | 0.5 | 1.0 | 1.5 |
| $N_2/Cl_2$ | 0.2 | 0.6 | 1.0 |
| $HCl/Cl_2$ | 0.0 | 0.15 | 0.3 |

For these experiments, the pressure was maintained at 200 mTorr and the magnetic field maintained at 20 Gauss. The cathode temperature was maintained at 80° C., and chamber wall temperature at 65° C. Helium was flowed at a pressure of 10 Torr on the backside of the wafer. The flow rate of the chlorine was maintained at 80 sccm, and the $BCl_3$ flow rate was maintained constant at about 9% of the combined flow rate of all the process gases. Of these examples, Example 5 with a power level of 700 watts, a xenon:chlorine ratio of 0.5, a nitrogen:chlorine ratio 0.2, and a HCl:chlorine ratio 0.2, provided the best results as measured by residue remaining after the stripping operation, roughness of the sidewalls of the features and etch selectivity ratio.

In general, reduced profile microloading was obtained, with the sidewalls 90 of the features 28 forming angles of 85° to 90° with the underlying wafer, regardless of the closeness of the features. However, in many of the examples the sidewalls 90 of the freshly etched features had rough edges, which is undesirable. It is believed that the rough edges occurred because the amount of passivating deposit formed on the sidewalls 90 of the features 28 was not sufficient. The sidewall roughness became worse as the power level and the $Xe/Cl_2$ ratio increased.

Satisfactory etch rates were also obtained. Although the etch rate of the aluminum layer did not substantially vary, the etch selectivity ratio (indicated by the thickness of the photoresist layer remaining on the substrate after etching "PR remaining"), varied with the power level. Higher power levels resulted in less photoresist remaining after the etching process.

Reduced deposition on the sidewalls 90 were also obtained. However, the higher xenon gas flow rates resulted in the formation of increased deposit 92 on the sidewalls 90 of the features 28 in the dense regions of the wafer substrate 20.

The critical distance measurements correspond to the width of the smallest feature in the center and in the edge of the wafer. The width of the smallest feature of these wafers should be about 0.6 microns. However, widths smaller than 0.6 microns were measured by scanning electron microscopy. The critical distance measurements were found to decrease with increasing power levels and increasing $Xe:Cl_2$ ratio.

Examples 15-27

The process conditions for examples 15 to 27 are shown in Table 5. Example 15, comprised of the prior art $Cl_2/BCl_3/N_2$ process gas composition, was used as a baseline for comparison with the results of xenon containing examples. Examples 16-27 were run to attempt to reduce the roughness in the sidewalls 90 of the features 28, and to reduce the amount of deposit 92 in the regions of the wafer with numerous closely spaced features.

TABLE 4

PROCESS CONDITIONS AND RESULTS OF EXAMPLES 5-14

| Examples | 5 | 6 | 7 | 8 | 9 | 10 | 11 | 12 | 13 | 14 |
|---|---|---|---|---|---|---|---|---|---|---|
| Power (watts) | 700 | 700 | 700 | 800 | 800 | 800 | 900 | 900 | 900 | 700 |
| $HCl:Cl_2$ ratio | 0.5 | 1 | 1.5 | 0.5 | 1 | 1.5 | 0.5 | 1 | 1.5 | 0.5 |
| $HCl:Cl_2$ ratio | 0.2 | 0.5 | 1 | 0.5 | 1 | 0.2 | 1 | 0.2 | 0.5 | 0.2 |
| $HCl:Cl_2$ ratio | 0 | 0.15 | 0.3 | 0.3 | 0 | 0.15 | 0.15 | 0.3 | 0 | 0 |
| DC Bias (volts) | 275 | 318 | 370 | 350 | 396 | 391 | 421 | 413 | 445 | 280 |
| Etch Time (SCS) | 85 | 90 | 981 | 87 | 94 | 96 | 90 | 81 | 94 | 79 |
| PR Remaining (micrometers) | 1.0 | 1.0 | 0.85 | 0.851 | 0.85 | 0.80 | 0.55 | 0.49 | 1.0 |  |
| Normalized PR Remaining[1] (micrometers) | 0.94 | 1.0 | 1.09 | 0.82 | 0.89 | 0.91 | 0.80 | 0.55 | 0.51 | 0.88 |

TABLE 4-continued

| | PROCESS CONDITIONS AND RESULTS OF EXAMPLES 5-14 | | | | | | | | | |
|---|---|---|---|---|---|---|---|---|---|---|
| Examples | 5 | 6 | 7 | 8 | 9 | 10 | 11 | 12 | 13 | 14 |
| Al-layer Etch Rate (microns/min) | 0.71 | 0.67 | 0.61 | 0.69 | 0.64 | 0.63 | 0.67 | 0.66 | 0.64 | 0.76 |
| Residue Post-etch[2] | 1.50 | 3.25 | 4.00 | 1.25 | 1.00 | 2.75 | 0.25 | 1.50 | 2.50 | 1.75 |
| Residue Post-strip[3] | 3.50 | 4.00 | 1.50 | 1.50 | 4.50 | 0.00 | 2.00 | 5.00 | 1.50 | |
| Critical Distance[4] (center) (micrometers) | 0.433 | 0.400 | 0.433 | 0.417 | 0.367 | 0.383 | 0.487 | | | |
| Critical Distance[5] (edge) (micrometers) | 0.4170 | 0.4000 | 0.4000 | .4000 | 0.4000 | 0.3330 | 0.3500 | 0.3670 | 0.3670 | 0.6330 |

[1](Normalized PR Remaining = PR Remaining × (etch time/90)
[2]Residue or deposit on sidewalls of features after etch process. The amount of residue was estimated on a scale of 0–5 with 5 representing a large amount of deposit. The residue was measured on the smallest feature of the wafer.
[3]Residue or deposit remaining on sidewalls of features after stripping the wafers (on a 0 to 5 scale).
[4]Width of smallest feature in central region of wafer.
[5]Width of smallest feature in outer edge region of wafer.

TABLE 5

| | PROCESS CONDITIONS AND RESULTS OF EXAMPLES 15-27 | | | | | | | | | | | | |
|---|---|---|---|---|---|---|---|---|---|---|---|---|---|
| EXAMPLE | 15[1] | 16 | 17 | 18 | 19 | 20 | 21 | 22 | 23 | 24 | 25 | 26 | 27 |
| Pressure (mTorr) | 200 | 200 | 200 | 200 | 200 | 200 | 200 | 200 | 200 | 200 | 200 | 200 | 100 |
| Power (Watts) | 800 | 800 | 800 | 800 | 700 | 600 | 500 | 500 | 500 | 500 | 500 | 500 | 500 |
| Magnetic Field (G) | 20 | 20 | 20 | 20 | 60 | 60 | 60 | 60 | 60 | 60 | 60 | 60 | 50 |
| $Cl_2$ (sccm) | 50 | 50 | 50 | 50 | 50 | 50 | 50 | 50 | 50 | 50 | 50 | 50 | 9 |
| $BCl_3$ (sccm) | 50 | 0 | 10 | 10 | 9 | 9 | 9 | 9 | 9 | 9 | 9 | 25 | |
| Xe (sccm) | 0 | 50 | 50 | 0 | 25 | 25 | 25 | 25 | 25 | 25 | 25 | 25 | 10 |
| $N_2$ (sccm) | 50 | 50 | 50 | 50 | 10 | 10 | 10 | 10 | 10 | 10 | 50 | 10 | 80 |
| $CF_4$ (sccm) | 0 | 0 | 0 | 0 | 0 | 0 | 0 | 0 | 5 | 0 | 0 | 5 | 0 |
| HCl (sccm) | 0 | 0 | 0 | 0 | 0 | 0 | 0 | 0 | 0 | 50 | 0 | 0 | 0 |
| Cathode Temp. (°C.) | 80 | 80 | 80 | 80 | 80 | 80 | 80 | 65 | 65 | 65 | 80 | 80 | 155 |
| Etch Time (secs) | 148 | 151 | 152 | 142 | 148 | 148 | 148 | 150 | 164 | 172 | 165 | 168 | 200 |
| DC Bias (volts) | 327 | 406 | 379 | 210 | 271 | 253 | ? | 204 | 184 | 206 | 202 | 220 | A |
| PR Residue[2] (micrometers) | B | B+ | B+ | B | A | A | A | A+ | A | A | A | ? | A− |
| Residue[3] (microns) | A | C | A | C | A− | A− | A | A− | D | C | C | D+ | C |
| Side-wall Roughness[3] | C(thick) | A | A | C(thick) | D+(thin) | D+(thin) | D+(thin) | D+(thin) | C(thin) | D(thin) | D(thin) | | A |

Note:
[1]Prior art.
[2]Photoresist thickness after etching.
[3]As measured by scanning electron microscopy, A = Best; B = Good; C = Poor.

These examples demonstrate that the residue 92 in the areas of the wafer with numerous closely-spaced features can be reduced by increasing the magnetic field from 20 to 60 Gauss, and by decreasing the $Cl_2$ flow rate to about 50 sccm. Also, the processes that have low pressures, such as Example 27 with a pressure of 100 mTorr, and the processes with low cathode temperatures, such as Example 22, generally provided features with smoother sidewalls.

In Example 16, xenon replaced the $BCl_3$ of Example 15, providing thinner sidewall deposition. In Example 17, $BCl_3$ was added to the process condition of Example 16, to show that $BCl_3$ is necessary to remove the residue. The removal of xenon in Example 18, resulted in high residue formation. In Example 19, the amount of chlorine was decreased, and the magnetic field was increased, resulting in less residue formation. In Example 20, reducing the power level somewhat improved the sidewall roughness. In Example 21, the power level was further reduced, causing undercutting during etching of the Ti layer. In Example 22, a lower temperature was maintained at the cathode, however, this resulted in more residue in the dense areas of the wafer. In Example 23, $CF_4$ was added causing more residue to accumulate. In Example 24, the addition of HCl caused more deposit to accumulate. In Example 25, the amount of nitrogen was increased, resulting in enhanced profile microloading. In Example 26, increasing the temperature of the cathode did not decrease residue formation. In Example 27, reducing the pressure caused more residue to form in the open areas of the substrate.

These examples demonstrate that a process according to the present invention has a high etch rate (greater than 5,000 Å per minute), good substrate to resist etch selectivity, and satisfactory sidewall profile of the features formed below the resist. Also, the process provides substantially reduced amounts of deposit on the chamber walls and on the sidewalls of the freshly etched channels. Furthermore, existing reactive-ion etching equipment can be used.

The present invention has been described in considerable detail with reference to certain preferred versions thereof, however, other versions are possible. For example, the etch process can be used to etch substrates other than semiconductor wafers. Therefore the spirit and scope of the appended claims should not be limited to the description of the preferred versions contained herein.

What is claimed is:

1. A method for selectively etching a substrate having grain boundaries and a resist material thereon, comprising the steps of:
   (a) placing a substrate into an etch zone;
   (b) introducing a process gas absent oxygen into the etch zone, the process gas comprising (i) a primary etchant selected from the group consisting of chlorine, fluorine and bromine, (ii) a secondary etchant suitable for etching grain boundaries in the substrate, and (iii) xenon; and
   (c) generating a substantially oxygen-free plasma in the etch zone to form an etch gas from the process gas, wherein the etch gas selectively etches the substrate.

2. The method of claim 1 wherein the substrate has a layer of oxide on its surface and the secondary etchant is suitable for etching the surface oxide layer.

3. The method of claim 1 wherein the secondary etchant is selected from the group consisting of $BCl_3$, $SiCl_4$, $CCl_4$, and mixtures thereof.

4. The method of claim 1 wherein the process gas further comprises a gas passivator.

5. The method of claim 4 wherein the gas passivator is selected from the group consisting of $N_2$, HCl, $CHF_3$, $CF_4$, $CH_4$, and mixtures thereof.

6. The method of claim 1 wherein the process gas further comprises a chlorofluorocarbon gas.

7. The method of claim 1 where the volumetric flow ratio of primary etchant:secondary etchant:xenon is selected so that the substrate to resist etching selectivity ratio is greater than about 2.5.

8. The method of claim 1 wherein the volumetric flow ratio of secondary etchant to primary etchant is selected so that the rate of etching of grain boundaries in the substrate is substantially the same as the rate of etching the grains.

9. The method of claim 1 wherein the volumetric flow ratio of secondary etchant to primary etchant is from about 0.1:1 to about 2:1.

10. The method of claim 9 wherein the volumetric flow ratio of secondary etchant to primary etchant is from about 0.3:1 to about 0.5:1.

11. The method of claim 1 wherein the volumetric flow ratio of xenon to primary etchant is selected so that the substrate is etched (i) substantially anisotropically, and (ii) at an etching rate higher than the rate at which the resist is etched.

12. The process of claim 1 wherein the volumetric flow ratio of xenon to primary etchant is from about 0.1:1 to about 1:1.

13. The process of claim 12 wherein the volumetric flow ratio of xenon to primary etchant is from about 0.2:1 to about 0.5:1.

14. The process of claim 4 wherein the volumetric flow ratio of passivator to primary etchant is less than about 1:1.

15. The process of claim 14 wherein the volumetric flow ratio of passivator to primary etchant is less than about 0.6:1.

16. The process of claim 1 where the step of introducing a process gas comprises introducing sufficient process gas that the rate of etching the substrate is greater than 5000 Å per minute.

17. The method of claim 1, wherein the substrate comprises a semiconductor wafer having a plurality of layers thereon, the layers being selected from the group consisting of metal, oxide, nitride, and silicide layers.

18. A method for selectively etching a wafer, the method comprising the steps of:
   (a) placing a substrate selected from the group consisting of silicon and gallium arsenide wafers into an etch zone, the substrate having thereon (i) a plurality of layers selected from the group consisting of metal, oxide, nitride and silicide layers, and (ii) a resist material;
   (b) introducing a process gas into the etch zone, the process gas comprising (i) a primary etchant $Cl_2$, (ii) a secondary etchant selected from the group consisting of $BCl_3$, $SiCl_4$, $CCl_4$, and mixtures thereof, and (iii) xenon, wherein the volumetric flow ratio of secondary etchant to primary etchant is from about 0.1:1 to about 2:1, and the volumetric flow ratio of xenon to primary etchant is from about 0.1:1 to about 1:1;
   (c) generating a plasma in the etch zone to generate from the process gas an etch gas that etches the layers on the substrate in preference to the resist material, to create volatile etch byproduct compounds; and
   (d) removing the volatile etch byproduct compounds from the etch zone.

19. The method of claim 18 wherein the process gas further comprises a passivator gas selected from the group consisting of $N_2$, HCl, $CHF_3$, $CF_4$, $CH_4$, and mixtures thereof, and wherein the volumetric flow ratio of the passivator gas to the primary etchant is less than about 1:1.

20. The method of claim 18 wherein the volumetric flow ratio of secondary etchant to primary etchant is from about 0.3:1 to about 0.5:1.

21. The method of claim 18 wherein the volumetric flow ratio of xenon to the primary etchant is from about 0.2:1 to about 0.5:1.

22. The method of claim 18 where the step of introducing a process gas comprises introducing sufficient process gas that the etch rate is greater than 5000 Å per minute.

23. A method for selectively etching layers on a silicon wafer, the method comprising the steps of:
   (a) placing a silicon wafer into an etch zone, the silicon wafer having thereon (i) a plurality of layers selected from the group consisting of metal, oxide, nitride, and silicide layers, and (ii) a resist material;
   (b) heating the wafer to a temperature above 70° C.;
   (c) introducing a process gas into the etch zone, the process gas comprising $Cl_2$, $BCl_3$, and xenon, wherein the volumetric flow ratio of $BCl_3$ to $Cl_2$ is from about 0.1:1 to about 2:1, and the volumetric flow ratio of xenon to $Cl_2$ is from about 0.1:1 to about 1:1;
   (d) maintaining the pressure in the etch zone at a pressure greater than about 1 mTorr;
   (e) generating an enhanced plasma in the etch zone by a method selected from the group consisting of electron cyclotron resonance, magnetically enhanced reactors, and inductively coupled plasma, so that an etch gas is generated from the process gas, and the etch gas etches the layers on the substrate in preference to the resist material, to create a volatile etch byproduct compounds; and (f) removing the volatile etch byproducts from the etch zone.

24. The process of claim 23 wherein the process gas further comprises a passivator gas selected from the group consisting of $N_2$, HCl, $CHF_3$, $CF_4$, $CH_4$, and mixtures thereof, and wherein the volumetric flow ratio of passivator gas to $Cl_2$ is from about 0.1:1 to about 1:1.

25. The process of claim 23 wherein the volumetric flow ratio of secondary etchant to primary etchant is from about 0.3:1 to about 0.5:1.

26. The process of claim 23 wherein the volumetric flow ratio of xenon to the primary etchant is from about 0.2:1 to about 0.5:1.

* * * * *